United States Patent
Lee et al.

(10) Patent No.: US 9,985,619 B2
(45) Date of Patent: May 29, 2018

(54) DUTY CYCLE CORRECTOR, SEMICONDUCTOR DEVICE INCLUDING THE SAME, AND METHOD OF OPERATING DUTY CYCLE CORRECTOR

(71) Applicant: Samsung Electronics Co., Ltd., Suwon-si, Gyeonggi-do (KR)

(72) Inventors: Hoon Lee, Seoul (KR); Joung-wook Moon, Hwaseong-si (KR); Seong-hwan Jeon, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/206,622

(22) Filed: Jul. 11, 2016

(65) Prior Publication Data

US 2017/0117887 A1    Apr. 27, 2017

(30) Foreign Application Priority Data

Oct. 21, 2015    (KR) .................. 10-2015-0146666

(51) Int. Cl.
*H03L 7/06* (2006.01)
*H03K 5/156* (2006.01)
*H03L 7/089* (2006.01)

(52) U.S. Cl.
CPC ......... *H03K 5/1565* (2013.01); *H03L 7/0891* (2013.01)

(58) Field of Classification Search
CPC ... H03K 5/1565; H03L 7/0893; H03L 7/0895; H03L 7/0896; H03L 7/0898; H03L 7/0891; H03L 7/083; H03L 7/085; H03L 7/087; H03L 7/089

USPC ........................................................ 327/157
See application file for complete search history.

(56) References Cited

U.S. PATENT DOCUMENTS

| | | | |
|---|---|---|---|
| 6,040,742 A * | 3/2000 | Bailey | H03L 7/087 327/157 |
| 7,015,739 B2 | 3/2006 | Lee et al. | |
| 7,142,028 B2 * | 11/2006 | Chun | H03K 5/1565 327/172 |
| 7,199,634 B2 * | 4/2007 | Cho | H03K 5/135 327/172 |
| 7,567,106 B2 | 7/2009 | Park et al. | |
| 7,956,659 B2 | 6/2011 | You et al. | |
| 8,149,978 B2 | 4/2012 | Ohtorno et al. | |
| 9,071,237 B2 | 6/2015 | Lee et al. | |
| 2007/0159224 A1 | 7/2007 | Dwarka et al. | |
| 2008/0164926 A1 | 7/2008 | Choi | |
| 2014/0266362 A1 | 9/2014 | Lee et al. | |

FOREIGN PATENT DOCUMENTS

JP    2004-350116 A    12/2004

\* cited by examiner

*Primary Examiner* — Patrick Chen
(74) *Attorney, Agent, or Firm* — Harness, Dickey & Pierce, P.L.C.

(57) ABSTRACT

A duty cycle corrector (DCC) includes a duty corrector circuit configured to adjust a duty of an input signal to output a duty-adjusted signal; a duty detector circuit configured to generate a correction code associated with the adjustment of the duty, based on a charge pump operation and a counting operation; and a timing controller configured to generate a first control signal associated with the charge pump operation and a second control signal associated with the counting operation in synchronization with a first clock.

15 Claims, 17 Drawing Sheets

DUTY CYCLE CORRECTOR, SEMICONDUCTOR DEVICE INCLUDING THE SAME, AND METHOD OF OPERATING DUTY CYCLE CORRECTOR

CROSS-REFERENCE TO RELATED APPLICATION

This application claims priority under 35 U.S.C. § 119 Korean Patent Application No. 10-2015-0146666, filed on Oct. 21, 2015, in the Korean Intellectual Property Office, the disclosure of which is incorporated herein in its entirety by reference.

BACKGROUND

At least some example embodiments of the inventive concepts relate to a duty cycle corrector (DCC), and more particularly, to a DCC with enhanced operation performance, a semiconductor device including the same, and a method of operating the duty cycle corrector.

Generally, semiconductor devices transmit or receive data therebetween at a high speed in synchronization with a clock signal. A DCC for adjusting a duty (i.e., duty cycle) of a clock signal to about 50% may be used for enhancing the characteristic of the clock signal supplied to a semiconductor device.

The DCC may include a charge pump including an output terminal to which one or more capacitors are connected, and sense an output of the charge pump to adjust a duty of a clock signal. The characteristics of the DCC are degraded due to various causes such as a develop time caused by the capacitors or ripple caused by a gain of the charge pump. Characteristic degradation which occurs in a duty cycle correction operation causes degradation in whole performance of a semiconductor device.

SUMMARY

According to at least one example embodiment of the inventive concepts, a duty cycle corrector (DCC) includes a duty corrector circuit configured to adjust a duty of an input signal to output a duty-adjusted signal; a duty detector circuit configured to generate a correction code associated with the adjustment of the duty, based on a charge pump operation and a counting operation; and a timing controller configured to generate a first control signal associated with the charge pump operation and a second control signal associated with the counting operation in synchronization with a first clock.

The duty corrector circuit may include a charge pump configured to receive an output signal fed back from the duty corrector circuit and output differential pump voltages based on a duty of the output signal; a comparator configured to generate a comparison result based on levels of the differential pump voltages; and a counter configured to generate the correction code by performing a counting operation based on the comparison result from the comparator.

The charge pump includes a first output terminal through which a first one of the differential pump voltages is output and a second output terminal through which a second one of the differential pump voltages is output, the charge pump is configured such that an operation of the charge pump includes, a develop period where the levels of the differential pump voltages are shifted according to the duty of the output signal, a sensing period where the differential pump voltages are supplied to the comparator, and a pre-charge period where the first and second output terminals are electrically connected to each other.

The first control signal may include a sensing control signal for activating the sensing period and a pre-charge control signal for activating the pre-charge period, and the timing controller may be configured such that the sensing control signal and the pre-charge control signal are each generated in synchronization with the first clock and have different phases.

The counter may be configured such that the counter performs the counting operation by, in response to the second control signal, counting the comparison result at a time after the sensing period ends.

The input signal may include a first signal and a second signal having opposite phases, and at least one of the first signal and the second signal may be supplied as the first clock to the timing controller.

The charge pump may include first and second capacitors connected to first and second output nodes, respectively; a first switch connected to the first output node to control an electrical connection between the first output node and a first input terminal of the comparator; a second switch connected to the second output node to control an electrical connection between the second output node and a second input terminal of the comparator; and a third switch configured to control an electrical connection between the first output node and the second output node.

The first control signal may include a sensing control signal configured to control the first switch and the second switch for voltages, respectively charged into the first and second capacitors, to be supplied to the comparator; and a pre-charge control signal configured to control the third switch to electrically connect the first output node to the second output node.

The input signal may be shifted between a logic low level and a logic high level, and the first control signal may be activated once in one logic level period of the input signal.

The duty corrector circuit may be configured to adjust the duty of the input signal to generate an output signal, the DCC may be configured such that the output signal is supplied to the duty detector circuit with a first delay, and the timing controller is configured to, receive information about the first delay, and adjust an activation timing of at least one of the first and second control signals, based on the information about the first delay.

The duty detector circuit may include a charge pump configured to receive an output signal fed back from the duty corrector circuit and output differential pump voltages based on a duty of the output signal; a comparator configured to generate a comparison result based on levels of the differential pump voltages; a counter configured to generate the correction code by performing a counting operation based on the comparison result from the comparator; and an average filter configured to receive a plurality of correction codes from the counter during a certain period and output an average value of the received plurality of correction codes to the duty corrector circuit as an average correction code.

The DCC is may be configured to store the average correction code in the duty corrector circuit, and the duty corrector circuit may adjust the duty of the input signal based on the stored average correction code when the duty detector circuit is disabled.

A semiconductor device includes a clock generator; and a duty cycle corrector (DCC) configured to receive a first clock signal from the clock generator and adjust a duty of the first clock signal to output a second clock signal, wherein the DCC includes, a duty corrector circuit configured to adjust the duty of the first clock signal, a timing controller configured to generate first and second control signals synchronized with a main clock, and a duty detector circuit including a charge pump, the charge pump being configured to generate differential pump voltages corresponding to a duty of the second control signal, the charge pump including a first output terminal through which a first one of the differential pump voltages is output and a second output terminal through which a second one of the differential pump voltages is output, the duty detector circuit being configured to, sense the differential pump voltages in response to the first control signal, and electrically connect the first and second output terminals in response to the second control signal.

The clock generator may include a delay locked loop (DLL) or a phase locked loop (PLL).

The duty detector circuit may include a counter configured to generate a correction code according to a result of the sensing; and an average filter configured to generate an average correction code corresponding to an average value of a plurality of correction codes, and the DCC may be configured such that the average filter is enabled during a certain period after the clock generator is disabled.

According to at least one example embodiment of the inventive concepts, a duty cycle corrector (DCC) includes a duty corrector circuit configured to output a duty-adjusted signal to a device by adjusting a duty cycle of an input signal based on a correction code; a duty detector circuit including a charge pump and a comparator, the charge pump being configured to generate first and second differential pump voltages, the comparator being configured sense the first and second differential pump voltages based on a sensing control signal, the comparator being configured to generate a comparison result based on the sensed first and second differential pump voltages, the duty detector circuit being configured to generate the correction code based on the comparison result; and a timing controller configured to receive delay information and generate the sensing control signal based on the delay information, the delay information indicating a delay with which the duty-adjusted signal is provided to the device.

The duty detector circuit may further include a counter configured to generate the correction code by performing a counting operation based on the comparison result.

The counter may be configured to generate the correction code in response to a code generation control signal.

The comparator may be configured to sense the first and second differential pump voltages during a sensing period defined by the sensing control signal.

The timing controller may be configured to generate the code generation control signal such that the counter generates the correction code after the sensing period.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
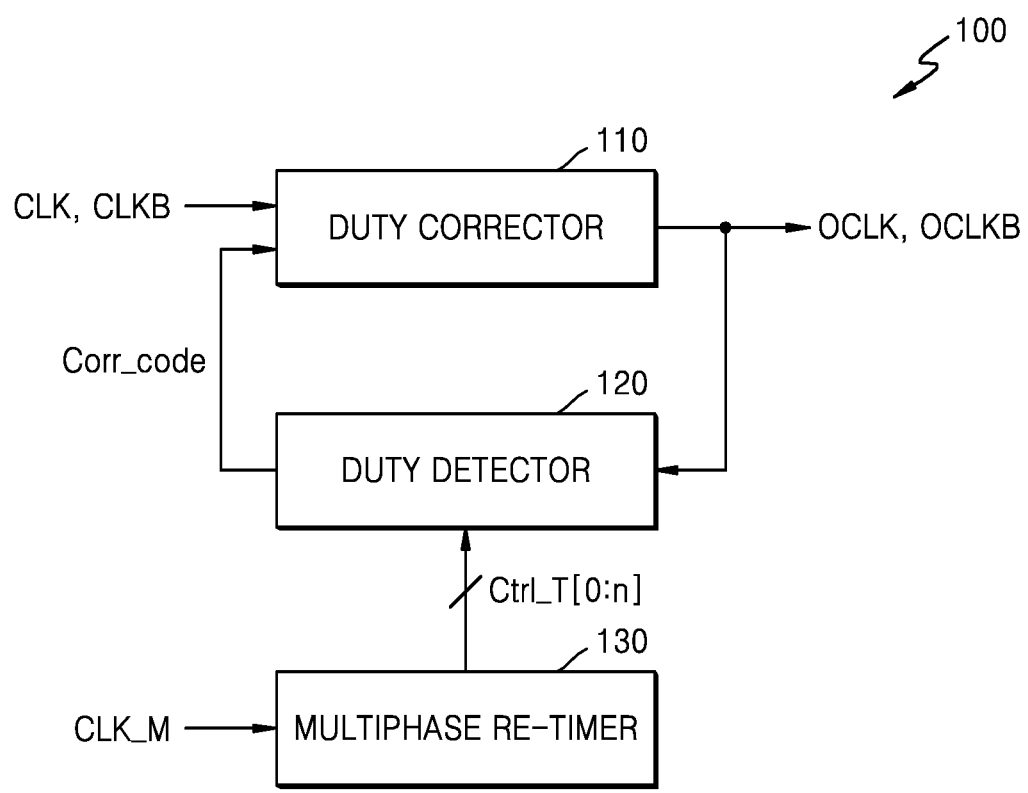
FIG. 1 is a block diagram illustrating a duty cycle corrector (DCC) according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a duty cycle corrector (DCC) 100 according to at least one example embodiment of the inventive concepts.

As illustrated in FIG. 1, the DCC 100 may include a duty corrector 110, a duty detector 120, and a multiphase re-timer 130. According to at least some example embodiments, the duty corrector 110 may be a circuit or circuitry (i.e., a duty corrector circuit) that includes a plurality of circuit blocks in association with a duty detection operation, and the multiphase re-timer 130 may be a circuit or circuitry (i.e., a multiphase re-timer circuit) that controls an operation timing of each of circuit blocks included in the duty detector 120. In this context, the multiphase re-timer 130 may be referred to as a timing controller or timing controller circuit.

The duty corrector 110 may receive clock signals CLK and CLKB as input signals and may adjust duties of the clock signals CLK and CLKB in response to a correction code Corr_code from the duty detector 120 to output a plurality of output signals OCLK and OCLKB. The output signals OCLK and OCLKB generated by adjusting the duties of the clock signals CLK and CLKB may be fed back to the duty detector 120. The output signals OCLK and OCLKB may be differential clock signals and may have complementary phases. Additionally, the output signals OCLK and OCLKB may be differential clock signals and may have complementary phases.

The duty detector 120 may be a circuit or circuitry (i.e., a duty detector circuit) that analyses waveforms of the output signals OCLK and OCLKB detects duties of the output signals OCLK and OCLKB and may generate the correction code Corr_code, based on a result of the detection. For example, the duty detector 120 may perform a charge pumping operation based on the output signals OCLK and OCLKB and may compare voltages (for example, pump voltages) which are output based on the charge pumping operation. Additionally, the correction code Corr_code may be generated by performing a counting operation based on a result of the comparison.

The multiphase re-timer 130 may receive a certain clock as a main clock CLK_M and may generate a plurality of control signals Ctrl_T[0:n] having different phases in synchronization with the main clock CLK_M. The control signals Ctrl_T[0:n] may be supplied to the circuit blocks included in the duty detector 120, and thus, each of the circuit blocks may operate in response to the control signals Ctrl_T[0:n]. For example, the multiphase re-timer 130 may receive one of the clock signals CLK and CLKB as the main clock CLK_M to generate the plurality of control signals Ctrl_T[0:n]. Additionally, for example, if the DCC 100 is included in a semiconductor device, the multiphase re-timer 130 may receive the main clock CLK_M from a separate clock generator included in the semiconductor device.

The duty detector 120 may include one or more charge pumps for performing the charge pumping operation. Since the output signals OCLK and OCLKB supplied to the duty detector 120 are differential clock signals, the one or more charge pumps may include first and second charge pumps for performing the charge pumping operation on the output signals OCLK and OCLKB. The first and second charge pumps may each include a capacitor. For example, the first charge pump may include a first capacitor (not shown) which is charged and discharged according to a waveform of the output signal OCLK, and the second charge pump may include a second capacitor (not shown) which is charged and discharged according to a waveform of the output signal OCLKB.

The duty detector 120 may include a comparator (not shown) for comparing output voltages (e.g., differential pump voltages) from the charge pumps. The comparator may receive voltages respectively output from the first and second capacitors and may a comparison operation using the received voltages. Additionally, a correction code generator (for example, a counter) included in the duty detector 120 may perform a counting operation based on a result of the comparison operation to generate the correction code Corr_code.

According to at least one example embodiment of the inventive concepts, the multiphase re-timer 130 may generate the plurality of control signals Ctrl_T[0:n] synchronized with the main clock CLK_M, and various operations of the duty detector 120 may be controlled based on the control signals Ctrl_T[0:n]. Therefore, the comparison operation and the counting operation may be performed at a time when the pumping voltages from the charge pumps are sufficiently developed, and moreover, an influence of ripple which occurs in the pumping voltages is reduced.

Moreover, each of the pump voltages from the charge pumps may be shifted periodically or non-periodically between a logic low level and a logic high level, and according to at least one example embodiment of the inventive concepts, the charge pumps may pre-charge the pump voltages according to control by the multiphase re-timer 130. Therefore, a speed at which levels of the pump voltages from the charge pumps are shifted is enhanced, and moreover, a time taken in duty correction is shortened.

Examples of an operation of a DCC configured as described above will be described below in detail.

Figure 2:
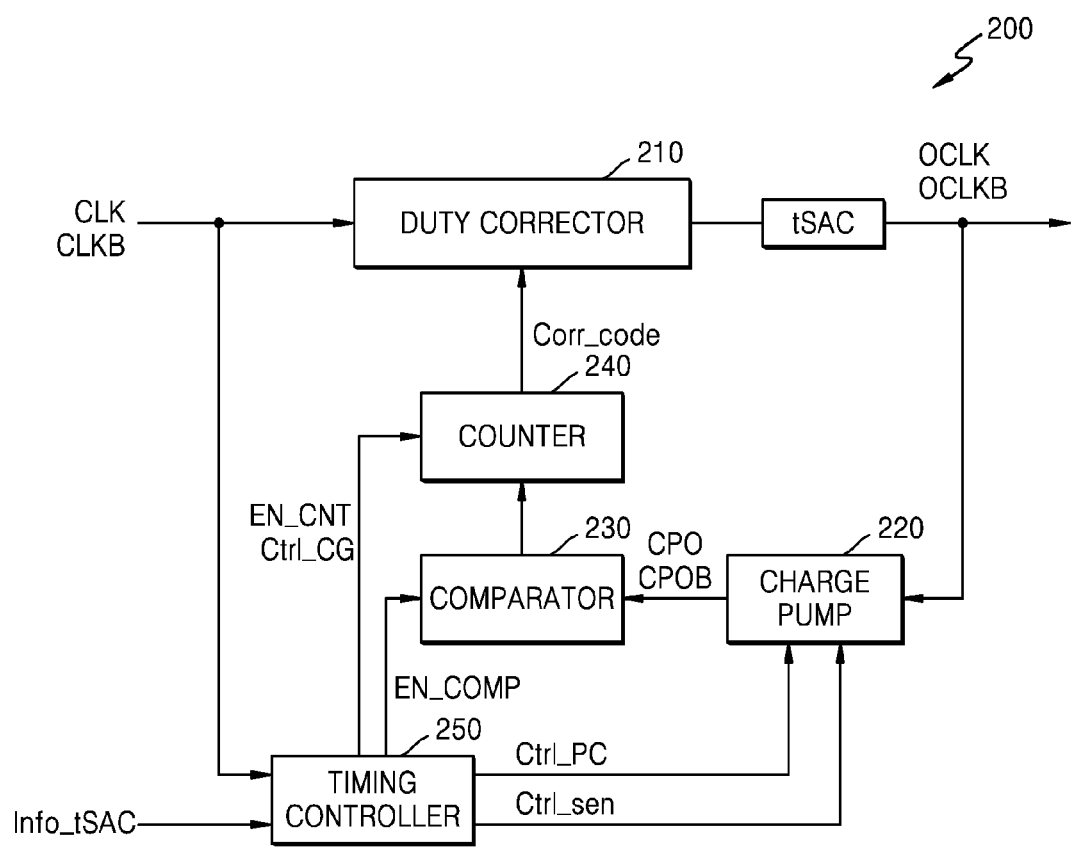
FIG. 2 is a block diagram illustrating an example of a detailed configuration of a DCC.

FIG. 2 is a block diagram illustrating an example of a detailed configuration of a DCC 200.

As illustrated in FIG. 2, the DCC 200 may include a duty corrector 210, a charge pump 220, a comparator 230, a counter 240, and a timing controller 250, each of which may be implemented as circuits or circuitry. Some circuit blocks illustrated in FIG. 2 may configure the duty detector according to the example illustrated in FIG. 1. For example, the duty detector 120 of FIG. 1 may include the charge pump 220, the comparator 230, and the counter 240 illustrated in FIG. 2. As another example, a case where the timing controller 250 is further included in the duty detector (e.g., the duty detector 120) will be described.

The duty corrector 210 may receive clock signals CLK and CLKB and may adjust duties of the clock signals CLK and CLKB to generate output signals OCLK and OCLKB. The output signals OCLK and OCLKB may be supplied to the charge pump 220.

The charge pump 220 may include a first capacitor, which is charged and discharged according to a waveform of a first output signal OCLK, and a second capacitor which is charged and discharged according to a waveform of a second output signal OCLKB. For example, the first capacitor may be charged with an electrical charge during a period where a level of the first output signal OCLK is high, and may discharge the charged electrical charge during a period where a level of the first output signal OCLK is low. Also, the second capacitor may be charged with an electrical charge during a period where a level of the second output signal OCLKB is high, and may discharge the charged electrical charge during a period where a level of the second output signal OCLKB is low. The charge pump 220 may output first and second pump voltages CPO and CPOB, based on a result of the charging and discharging.

The first pump voltage CPO may correspond to an average of electrical charges charged into the first capacitor, and the second pump voltage CPOB may correspond to an average of electrical charges charged into the second capacitor. Therefore, if duties of the output signals OCLK and OCLKB used to detect a duty are 50:50, levels of the first and second pump voltages CPO and CPOB may be the same. However, if a period where the first output signal OCLK is high is wide in width and thus duties are asymmetrical, the first pump voltage CPO may have a value greater than that of the second pump voltage CPOB. On the other hand, if a period where the first output signal OCLK is low is wide in width and thus the duties are asymmetrical, the second pump voltage CPOB may have a value greater than that of the first pump voltage CPO.

Moreover, levels of the first and second pump voltages CPO and CPOB from the charge pump 220 may be developed according to duties of the output signals OCLK and OCLKB. The comparator 230 may receive and compare the first and second pump voltages CPO and CPOB to output a result of the comparison. For example, when a level of the first pump voltage CPO is higher, the comparator 230 may output a first-state comparison result, but when a level of the second pump voltage CPOB is higher, the comparator 230 may output a second-state comparison result.

The counter 240 may receive the comparison result from the comparator 230 and may perform a counting operation based on the comparison result. For example, when the comparator 230 outputs the first-state comparison result, the counter 240 may perform the counting operation based on a positive (+) value, but when the comparator 230 outputs the second-state comparison result, the counter 240 may perform the counting operation based on a negative (−) value. The counter 240 may generate a correction code Corr_code having one or more bit values, based on a result of the counting and may supply the correction code Corr_code to a duty corrector 210.

The timing controller 250 may generate a plurality of timing control signals synchronized with the clock signals CLK and CLKB. For example, the timing controller 250 may generate a first enable signal EN_COMP for enabling the comparator 230 and may also generate a second enable signal EN_CNT for enabling the counter 240. Also, the timing controller 250 may generate a sensing control signal Ctrl_sen and a pre-charge control signal Ctrl_PC for controlling an operation of the charge pump 220. Also, the timing controller 250 may generate a code generation control signal Ctrl_CG for activating a counting operation of the counter 240. The counter 240 may generate the correction code Corr_code in response to the code generation control signal Ctrl_CG.

The DCC 200 may be enabled in an initial operation of a semiconductor device and may perform a duty correction operation in order for duties of the output signals OCLK and OCLKB used in the semiconductor device to have symmetrical characteristic. The comparator 230 and the counter 240 may be enabled during a period where the DCC 200 is enabled. The correction code Corr_code may be stored in the DCC 200, and thus, even after the DCC 200 is disabled (or after a feedback structure is broken), the duty corrector 210 may correct duties of the clock signals CLK and CLKB, based on the stored correction code Corr_code. In an embodiment, the correction code Corr_code may be stored in the duty corrector 210, for example, in a volatile manner. Thus, when power is again supplied to the semiconductor device (or when warm booting is performed), the DCC 200 may be again enabled, and the correction code Corr_code may be again generated.

Levels of the first and second pump voltages CPO and CPOB from the charge pump 220 may be developed according to the duties of the output signals OCLK and OCLKB, and a sensing operation and a pre-charge operation of the charge pump 220 may be controlled based on the develop characteristics of the levels of the first and second pump voltages CPO and CPOB from the charge pump 220. For example, the sensing control signal Ctrl_sen may be activated at a time when the levels of the first and second pump voltages CPO and CPOB are sufficiently developed, the first and second pump voltages CPO and CPOB having a level difference suitable for the duty characteristics of the output signals OCLK and OCLKB may be supplied to the comparator 230. Also, as the pre-charge control signal Ctrl_PC is activated after a sensing period, a pre-charge operation based on the first and second pump voltages CPO and CPOB may be performed, and thus, a time for which a logic level of each of the first and second pump voltages CPO and CPOB is shifted is shortened.

The output signals OCLK and OCLKB from the duty corrector 210 may be supplied to an internal circuit of the semiconductor device with a certain delay tSAC, and moreover, the output signals OCLK and OCLKB in which delay characteristic is reflected may be supplied to the charge pump 220. According to at least one example embodiment of the inventive concepts, the timing controller 250 may further receive delay information Info_tSAC and may adjust a time when various control signals are each activated, based on the delay information Info_tSAC. For example, a time when the sensing control signal Ctrl_sen is activated may be adjusted based on the delay information Info_tSAC, and thus, sensing is prevented from being performed at a time when the first and second pump voltages CPO and CPOB are not sufficiently developed or a time when ripple is large.

The elements according to the embodiment of FIG. 2 correspond to merely an embodiment, and the DCC according to at least one example embodiment of the inventive concepts may be variously implemented. According to at least one example embodiment of the inventive concepts, the DCC according to at least one example embodiment of the inventive concepts may further include various converters for converting a signal, transferred in the DCC, into an analog signal or a digital signal or various elements used to correct a duty.

Figure 3:
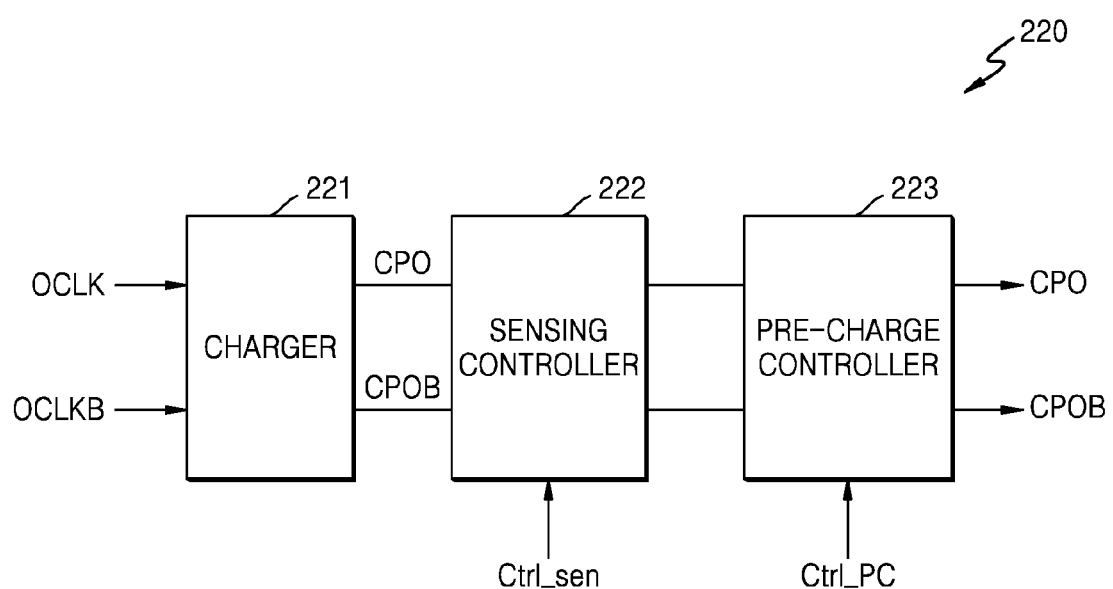
FIG. 3 is a block diagram illustrating an implementation example of a charge pump of FIG. 2.

FIG. 3 is a block diagram illustrating an implementation example of the charge pump 220 of FIG. 2. Referring to FIGS. 2 and 3, the charge pump 220 may include a charger 221, a sensing controller 222, and a pre-charge controller 223, each of which may be implemented as circuits or circuitry. The charger 221 may include one or more capacitors. The charger 221 may perform a charge and discharge operation on the capacitors according to waveforms of the output signals OCLK and OCLKB. The sensing controller 222 may control the supply of the first and second pump voltages CPO and CPOB to the comparator 230 as outputs of the charge pump 220. Also, the pre-charge controller 223 may electrically connect the capacitors that respectively supply the first and second pump voltages CPO and CPOB, thereby controlling a pre-charge operation based on the first and second pump voltages CPO and CPOB.

As in the above-described embodiment, the sensing controller 222 may operate in response to the sensing control signal Ctrl_sen, and the pre-charge controller 223 may operate in response to the pre-charge control signal Ctrl_PC. Additionally, the sensing control signal Ctrl_sen and the pre-charge control signal Ctrl_PC may each be a signal synchronized with a certain main clock (for example, the clock signals CLK and CLKB), and a time when the sensing control signal Ctrl_sen and the pre-charge control signal Ctrl_PC are each activated may be adjusted by reflecting the develop characteristics of the first and second pump voltages CPO and CPOB.

According to the above-described embodiment, the sensing control signal Ctrl_sen may be activated based on the develop characteristics of the first and second pump voltages CPO and CPOB, and thus, the duty correction performance of the DCC 200 is enhanced. Additionally, a period where a logic level of each of the first and second pump voltages CPO and CPOB is shifted may be set to be short based on a pre-charge operation, and thus, a whole period of a duty correction operation is reduced.

Figure 4:
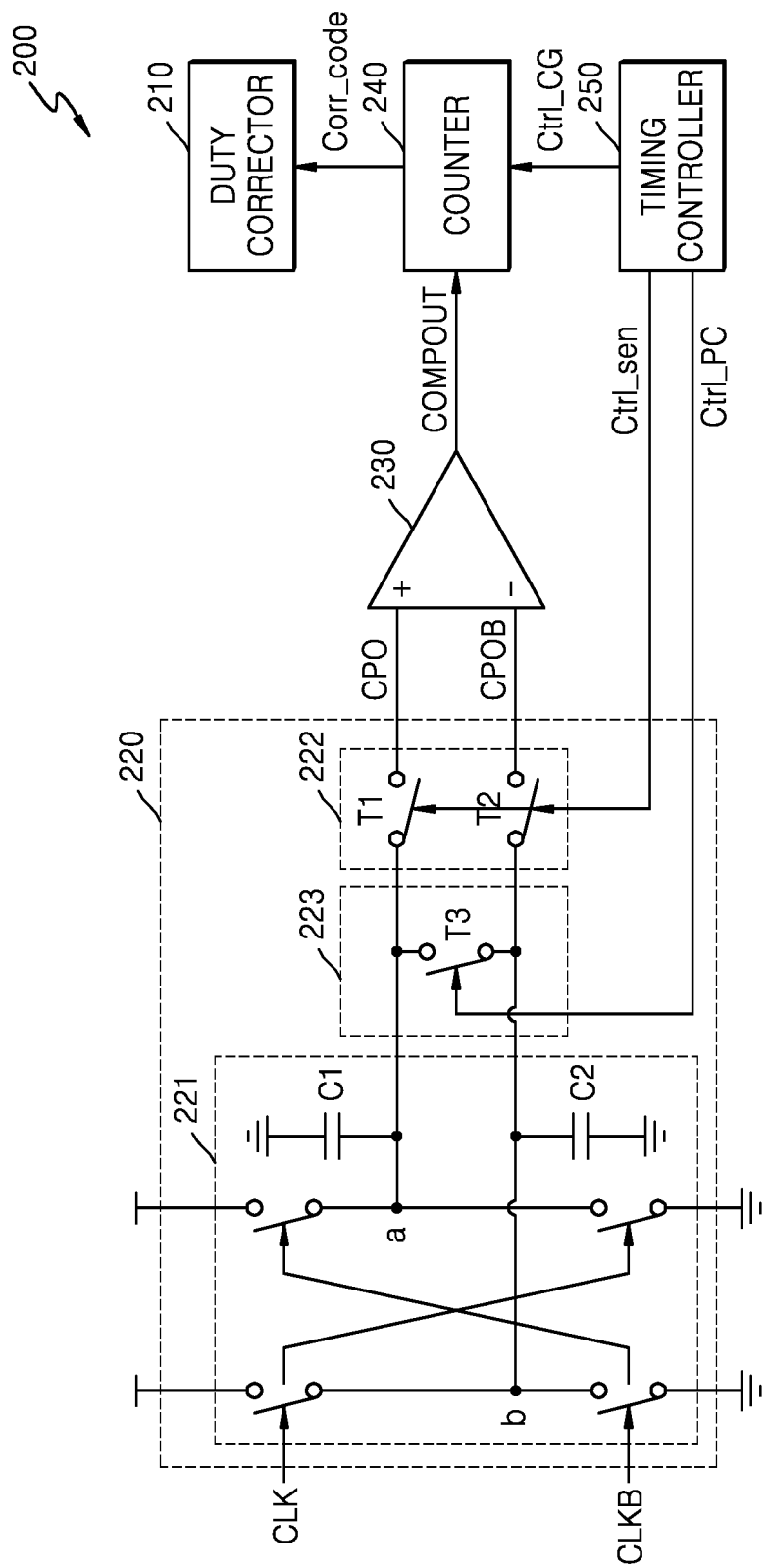
FIG. 4 is a block diagram illustrating a DCC according to at least one example embodiment of the inventive concepts.
Figure 5A:
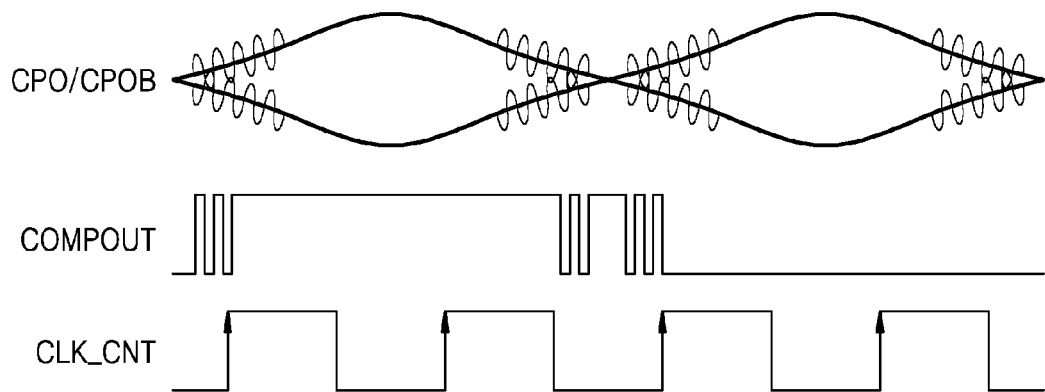
FIGS. 5A and 5B are waveform diagrams showing an operation example of the DCC of FIG. 4.
Figure 5B:
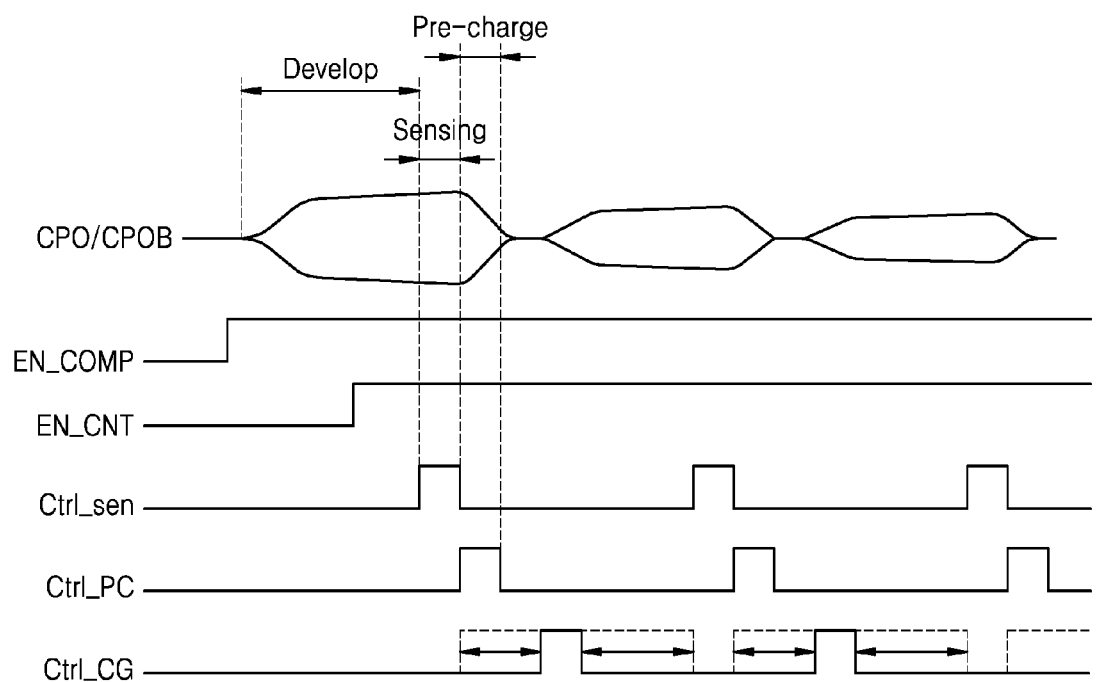

Hereinafter, example operations of a DCC according to at least one example embodiment of the inventive concepts will be described with reference to a circuit and a waveform. FIG. 4 is a block diagram illustrating the DCC 200 according to at least one example embodiment of the inventive concepts. FIGS. 5A and 5B are waveform diagrams showing an operation example of the DCC 200 of FIG. 4.

As illustrated in FIG. 4, the DCC 200 may include the duty corrector 210, the charge pump 220, the comparator 230, the counter 240, and the timing controller 250. As is described above with reference to FIG. 3, some circuit blocks illustrated in FIG. 4 may form a duty detector. For example, the duty detector 120 of FIG. 1 may be implemented in FIG. 4 as the charge pump 220, the comparator 230, and the counter 240. In the circuit diagram of FIG. 4, an operation according to embodiments is conceptually illustrated. However, the DCC 200 according to at least one example embodiment of the inventive concepts may substantially further include other various circuit elements. For example, with respect to switches included in the charge pump 220, a design may be changed in various forms.

The charge pump 220 may further include a charger 221 that receives clock signals CLK and CLKB as differential input signals and performs a charge and discharge operation on first and second capacitors C1 and C2 in response to the clock signals CLK and CLKB. Also, the charge pump 220 may include a sensing unit 222 that performs the sensing operation according to the above-described embodiment. The sensing unit 222 may include a first switch T1 connected to a first output terminal "a" of the charge pump 220 and a second switch T2 connected to a second output terminal "b" of the charge pump 220. For example, the first switch T1 may be connected between the first output terminal "a" and a first input terminal (+) of the comparator 230, and the second switch T2 may be connected between the second output terminal "b" and a second input terminal (−) of the comparator 230.

The charge pump 220 may include a pre-charger 223 that performs the pre-charge operation according to the above-described embodiment. The pre-charger 223 may include a third switch T3 connected between the first output terminal "a" and the second output terminal "b" of the charge pump 220. The first and second pump voltages CPO and CPOB may be supplied to the comparator 230 through the first output terminal "a" and the second output terminal "b" of the charge pump 220.

As is discussed above, the timing controller 250 may generate a sensing control signal Ctrl_sen and a pre-charge control signal Ctrl_PC, the first switch T1 and the second switch T2 may be turned on/off in response to the sensing control signal Ctrl_sen, and the third switch T3 may be turned on/off in response to the pre-charge control signal Ctrl_PC. In addition, the timing controller 250 may supply, to the counter 240, a code generation control signal Ctrl_CG for controlling a timing when a correction code Corr_code is generated. An example of an operation of each of the counter 240 and the duty corrector 210 is the same as or similar to that described above (e.g., with respect to FIG. 2).

An operation of the circuit illustrated in FIG. 4 will be described below with reference to FIGS. 5A and 5B.

Referring first to FIG. 5B, as the DCC 200 is enabled, the comparator 230 and the counter 240 may be enabled. For example, the comparator 230 and the counter 240 may be sequentially enabled according to control signals EN_COMP and EN_CNT from the timing controller 250. As the clock signals CLK and CLKB are received, the charge and pre-charge operation may be performed for the first and second capacitors C1 and C2 included in the charge pump 220, and the first and second pump voltages CPO and CPOB having waveforms shown in FIG. 5B may be generated based on electrical charges charged into the first and second capacitors C1 and C2. As asymmetricity between duties of the clock signals CLK and CLKB increases, a level difference between the first and second pump voltages CPO and CPOB may increase.

As the sensing control signal Ctrl_sen is activated after the first and second pump voltages CPO and CPOB are sufficiently developed, the first switch T1 and the second switch T2 may be turned on, and thus, the first and second pump voltages CPO and CPOB may be supplied as inputs of the comparator 230. The comparator 230 may output a comparison result COMPOUT based on the level difference between the first and second pump voltages CPO and CPOB. Considering that the comparison result COMPOUT for generating the correction code Corr_code is generated, a period where the sensing control signal Ctrl_sen is activated may be referred to as a sensing period.

Subsequently, as the sensing control signal Ctrl_sen is deactivated and the pre-charge control signal Ctrl_PC is activated, the DCC 200 may enter a pre-charge period. Therefore, as the first and second switches T1 and T2 are turned off and the third switch T3 is turned on, the first output terminal "a" may be electrically connected to the second output terminal "b". Also, as the first output terminal "a" is electrically connected to the second output terminal "b", levels of the first and second pump voltages CPO and CPOB may be quickly shifted so as to become equal. That is, the logic levels of the first and second pump voltages CPO and CPOB may be more quickly shifted by the pre-charge period than a case where a logic level is normally shifted by a charge pumping operation.

A time at which the correction code Corr_code is generated may be variably adjusted. For example, the correction code Corr_code may be generated in a period where the code generation control signal Ctrl_CG supplied to the counter 240 is activated. The comparator 230 may be electrically disconnected from the output terminals "a" and "b" of the charge pump 220 after the sensing period, and an output of the comparison result COMPOUT corresponding to the first and second pump voltages CPO and CPOB supplied to the comparator 230 during the sensing period may be maintained. Although not shown in FIG. 4, a voltage having a certain level (e.g., a voltage having a common level) may be supplied to the input terminal of the comparator 230 in order for the input terminal of the comparator 230 not to be floated during the pre-charge period. Additionally, the code generation control signal Ctrl_CG may be activated in an arbitrary period between a time when a previous sensing period ends and a time when a next sensing period starts.

In the DCC 200 according to at least one example embodiment of the inventive concepts, the first and second pump voltages CPO and CPOB may be shifted between a logic low level and a logic high level a plurality of times during the duty correction period, and during each of a logic high period and a logic low period, sensing may be performed at a time when levels of the first and second pump voltages CPO and CPOB are sufficiently developed. Additionally, the sensing operation may be performed in a period other than a period where large ripple occurs in the first and second pump voltages CPO and CPOB. To this end, a plurality of control signals from the timing controller 250 may be generated in synchronization with a main clock, and in generating the plurality of control signals according to at least one example embodiment of the inventive concepts, delay information tSAC of the output signals OCLK and OCLKB may be further referred to.

On the other hand, if the above-described embodiments are not applied, as shown in FIG. 5A, a time when levels of the first and second pump voltages CPO and CPOB are shifted may not be synchronized with a time when a control clock CLK_CNT for generating the correction code is activated. In this case, the correction code is generated at a time when large ripple occurs in the first and second pump voltages CPO and CPOB, and for this reason, an accuracy of a duty correction operation is degraded. Additionally, logic levels of the first and second pump voltages CPO and CPOB are shifted late, and thus, the sensing operation may be performed at least twice in one logic period, causing an increase in time taken in duty correction.

That is, according to the above-described embodiments, since the sensing operation is performed according to multiphase control signals synchronized with a certain clock and sensing performed at a time when levels of the first and second pump voltages CPO and CPOB are sufficiently developed is adjusted in timing, it is not required to increase a size of a capacitor for reducing ripples, and thus, an implementation area of the DCC 200 is reduced. Further, if the size of the capacitor increases, a time for which levels of the first and second pump voltages CPO and CPOB are developed increases, and moreover, a time taken in duty correction increases. However, according to the above-described embodiment, an increase in size of a capacitor is reduced or, alternatively, minimized, and levels of the first and second pump voltages CPO and CPOB are quickly shifted through the pre-charge period, thereby shortening a time taken in duty correction.

Figure 6:
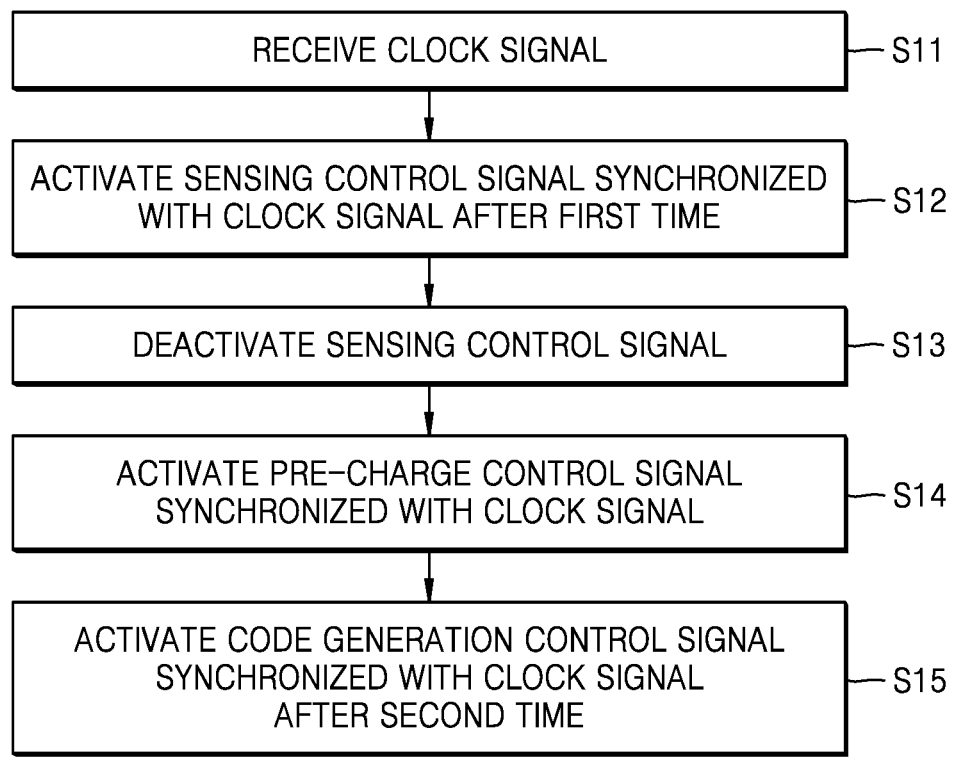
FIGS. 6 and 7 are flowcharts illustrating a method of operating a DCC according to embodiments.
Figure 7:
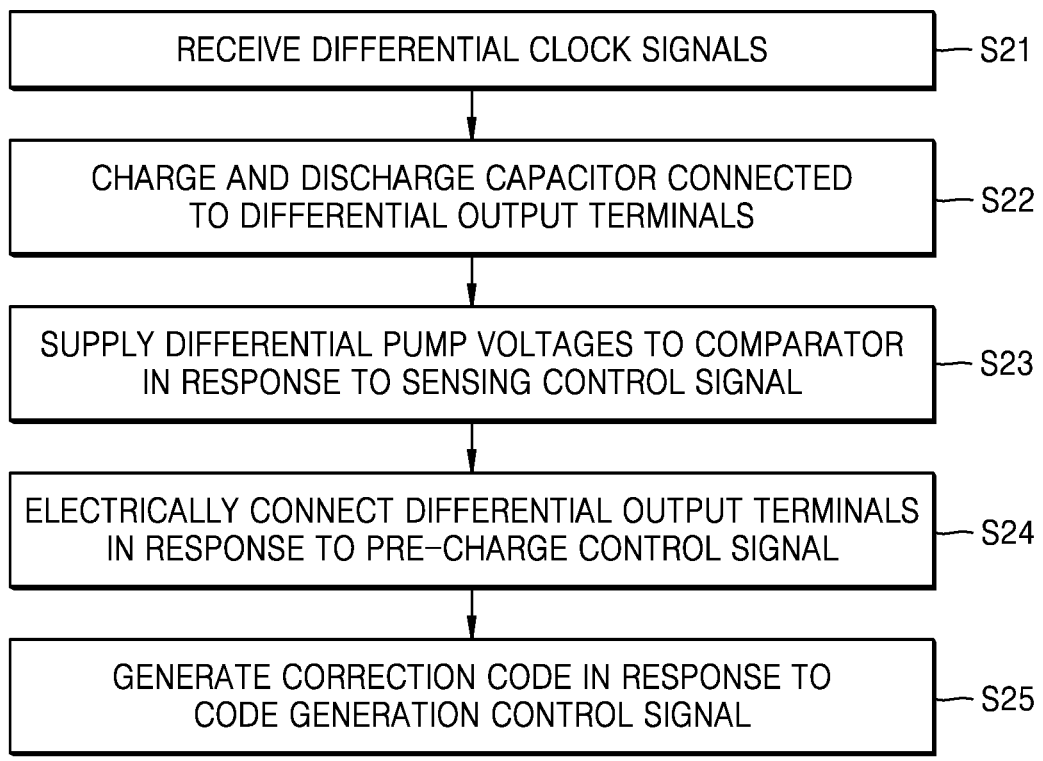

FIGS. 6 and 7 are flowcharts illustrating a method of operating a DCC according to embodiments.

As illustrated in FIG. 6, a clock signal a duty cycle of which is to be corrected may be received in operation S11. For example, the clock signal may be a main clock which is used in a semiconductor device. Additionally, for example, the clock signal may be output from a clock generator (for example, a phase locked loop (PLL) or a delay locked loop (DLL)) included in the semiconductor device. Further, for example, the clock signal may be differential clock signals having complementary phases.

The received clock signal may be supplied to a charge pump included in a DCC, and an output (for example, differential pump voltages having complementary phases) of the charge pump may be generated based on a duty of the clock signal. Further, a plurality of control signals synchronized with the clock signal may be generated based on the clock signal, and after a first time (i.e., a first period of time) elapses from the reception of the clock signal, a sensing control signal synchronized with the clock signal may be activated in operation S12. The output of the charge pump may be supplied to a comparator included in the DCC during a period where the sensing control signal is activated, and the comparator may generate and output a result of comparison which is performed for the differential pump voltages.

Subsequently, the sensing control signal may be deactivated, and thus, a sensing period may end in operation S13, and a pre-charge control signal synchronized with the clock signal may be activated in operation S14. Two output terminals of the charge pump may be electrically connected to each other during a period where the pre-charge control signal is activated, and thus, logic levels of the differential pump voltages may be quickly shifted. After a second time (for example, after the second time elapses from the reception of the clock signal), a code generation control signal synchronized with the clock signal may be activated in operation S15, and a correction code may be generated according to the code generation control signal being activated.

Referring to FIG. 7, a charge pump included in a DCC may receive differential clock signals in operation S21, and may output differential pump voltages respectively corresponding to voltages applied to capacitors (for example, first and second capacitors) respectively connected to differential output terminals. For example, the charge pump may perform a charge and discharge operation on the capacitors according to the differential clock signal in operation S22, and may supply the differential pump voltages to a comparator included in the DCC through the differential output terminals in response to a sensing control signal synchronized with a main clock in operation S23.

A point in time when the sensing control signal is activated may correspond to a point time when the differential pump voltages are sufficiently developed. According to at least some example embodiments of the inventive concepts, a sensing period may be defined by the period of time during which the sensing control signal is activated (e.g., period of time during which the sensing control signal is has a high level). Further, and a pre-charge control signal may be activated at the end of the sensing period. According to at least some example embodiments of the inventive concepts, a pre-charge period may be defined by the period of time during which the pre-charge control signal is activated (e.g., period of time during which the pre-charge control signal is has a high level.) The differential output terminals may be electrically connected to each other in response to the activated pre-charge control signal in operation S24, and the differential output terminals of the charge pump may be electrically disconnected from input terminals of the comparator during the pre-charge period.

The differential output terminals may be electrically connected to each other during the pre-charge period, and thus, logic levels of the differential pump voltages may each be shifted to a medium level between a logic high level and a logic low level. Therefore, a time for which the logic level of each of the differential pump voltages is shifted is shortened. Additionally, a code generation control signal may be activated during a certain period after the sensing period ends, and a counter included in the DCC may generate a correction code in response to the code generation control signal in operation S25.

Figure 8:
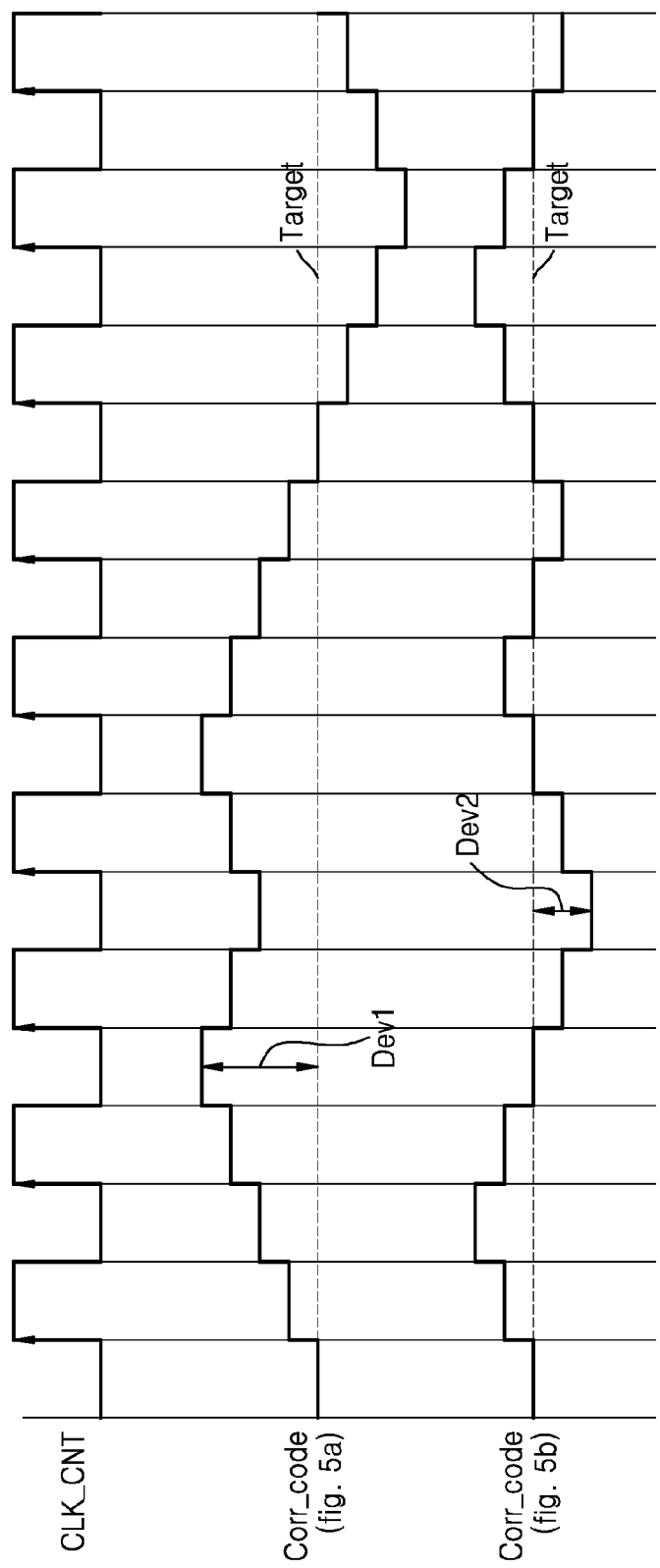
FIG. 8 is a waveform diagram showing an example of a correction code generated according to embodiments.

FIG. 8 is a waveform diagram showing an example of a correction code generated according to embodiments.

Referring to FIG. 8, it may be assumed that a correction code Corr_code is generated in a DCC at a time when a control clock CLK_CNT rises. According to the above-described embodiments, the control clock CLK_CNT may correspond to a code generation control signal Ctrl_CG which is generated in synchronization with a main clock.

The DCC may have a feedback structure where the DCC receives an output thereof to detect and correct a duty, and thus, the correction code Corr_code generated in the DCC may converge to a certain value (for example, a target value). A value of the correction code Corr_code may converge to the target value after a duty correction operation is performed during a certain period, and the correction code Corr_code the value of which has converged may be stored in the DCC.

According to the waveform diagram of FIG. 5A to which the above-described examples (i.e., examples illustrated, for example, in FIGS. 1-4 and/or 6-7) are not applied, a counting operation may be performed a plurality of times according to the control clock CLK_CNT during a logic period (for example, a period where one pump voltage maintains the same logic level) of one of the first and second pump voltages CPO and CPOB, and the same value (for example, +1 or −1) may be repeatedly counted in the one logic period. Therefore, as illustrated in FIG. 8, a value of the correction code Corr_code may be changed in a state of having a large deviation Dev1 with respect to a target value, and thus, a time taken in correcting a duty of a clock signal may have a large value.

On the other hand, according to the waveform diagram of FIG. 5B to which examples (i.e., examples illustrated, for example, in FIGS. 1-4 and/or 6-7) are applied, the logic levels of the first and second pump voltages CPO and CPOB may be shifted quickly, and thus, the counting operation may be performed a relatively smaller number of times during one logic period. A logic period may be defined, for example, as a period where one pump voltage maintains the same logic level. For example, only a one-time counting operation may be performed in one logic period. Therefore, as illustrated in FIG. 8, the value of the correction code Corr_code may be changed in a state of having a small deviation Dev2 with respect to the target value, and thus, a time taken in correcting a duty of a clock signal may have a small value.

Figure 9:
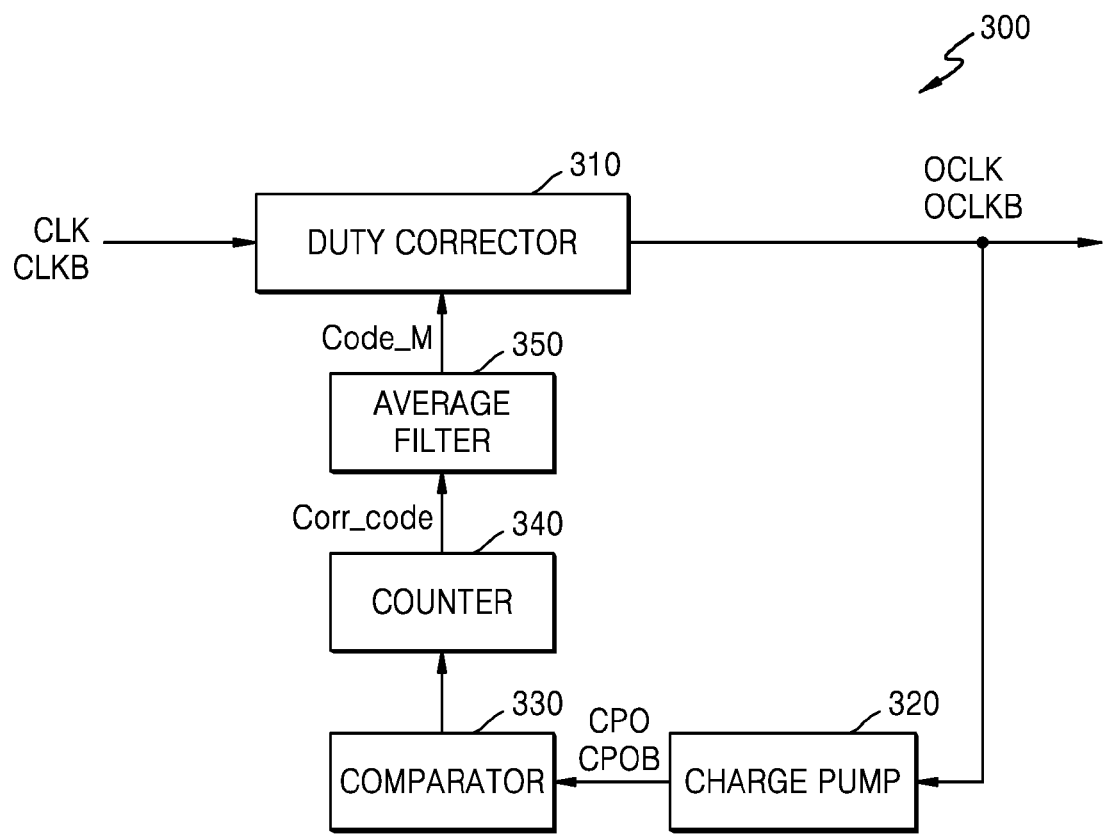
FIGS. 9 and 10 are block diagrams illustrating an implementation example of a DCC according to embodiments.
Figure 10:
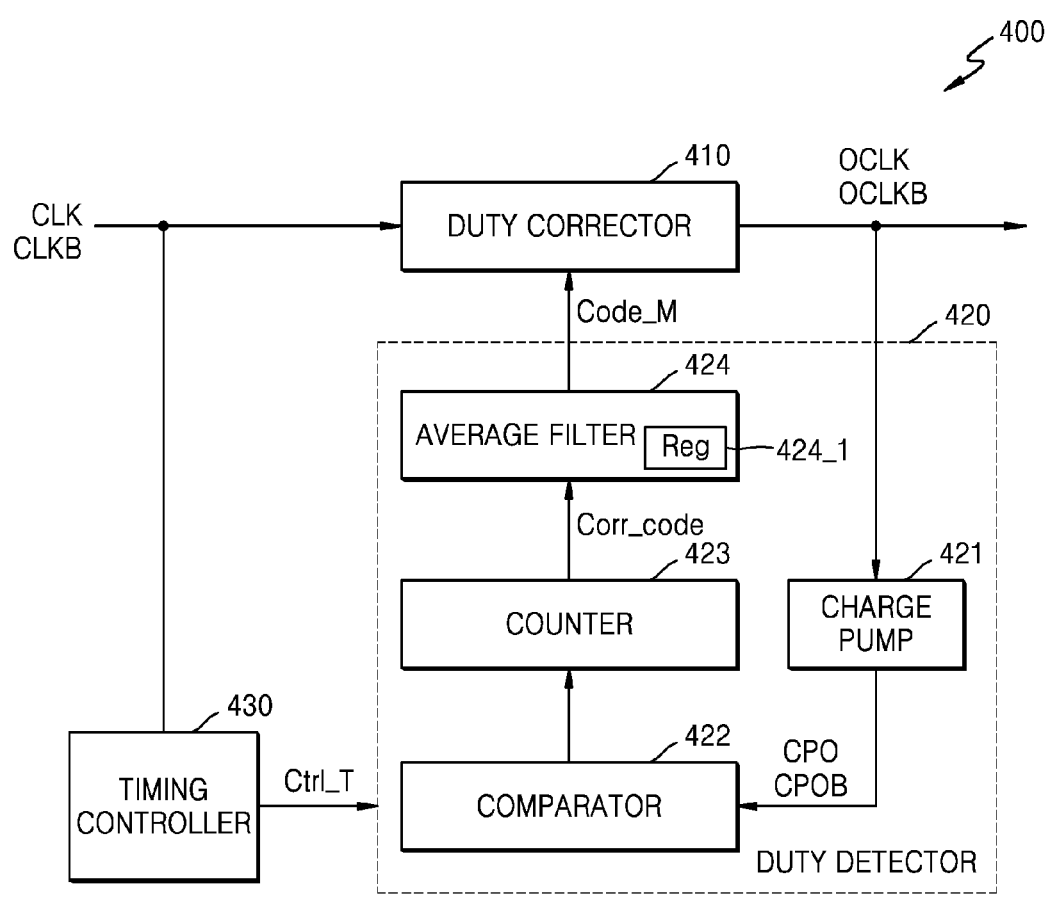

FIGS. 9 and 10 are block diagrams illustrating an implementation example of a DCC according to embodiments.

Referring to FIG. 9, a DCC 300 may include a duty corrector 310, a charge pump 320, a comparator 330, a counter 340, and an average filter 350, each of which may be implemented as circuits or circuitry. Some circuit blocks illustrated in FIG. 8 may for a duty detector. For example, the duty detector 120 of FIG. 1 may be implemented in FIG. 8 as the charge pump 320, the comparator 330, and the counter 340. As another example, a case where the average filter 350 is further included in the duty detector will be described.

The duty corrector 310 may receive clock signals CLK and CLKB and may correct a duty ratio of the clock signals CLK and CLKB to generate output signals OCLK and OCLKB. The output signals OCLK and OCLKB may be supplied to the charge pump 320. According to at least some example embodiments of the inventive concepts, the structures and/or operations of the charge pump 320, the comparator 330, and the counter 340 may be identical or similar to those of the charge pump 220, the comparator 230, and the counter 240 described above.

The DCC 300 may have a structure where the output signals OCLK and OCLKB are fed back, and thus, a duty detection operation and a duty correction operation may be repeatedly performed while the DCC 300 is being enabled. That is, the counter 340 may repeatedly generate a correction code Corr_code for controlling duty correction.

Since the duty detection operation and the duty correction operation are performed iteratively, duties of the output signals OCLK and OCLKB may be symmetrically adjusted, and thus, a value of the correction code Corr_code may converge to a target value. Consequently, an amount by which the value of the correction code Corr_code changes may decrease progressively. That is, the value of the correction code Corr_code may converge to a value corresponding to a case where the duties of the output signals OCLK and OCLKB are symmetrical. The average filter 350 may receive a plurality of the correction codes Corr_code from the counter 340, calculate an average value of the plurality of correction codes Corr_code, and output the calculated average value as a correction code (hereinafter referred to as an average correction code Code_M) for adjusting duties of the clock signals CLK and CLKB.

The average filter 350 may generate the average correction code Code_M through an operation of calculating an average value according to various methods. For example, the average filter 350 may sequentially receive the plurality of correction codes Corr_code from the counter 340, and each of the plurality of correction codes Corr_code may include one or more bits. The plurality of correction codes Corr_code may have different values, based on the duties of the clock signals CLK and CLKB, and the average n filter 350 may perform an arithmetic operation on the values of the correction codes Corr_code to calculate an average value of the values of the correction codes Corr_code.

As is described above, for example with respect to the counter 240, the counter 340 may generate the correction code Corr_code in response to a control signal (for example, a code generation control signal) which is activated at a certain time, and one control code (for example, a correction code which is generated immediately before the DCC is disabled) may be stored in the counter 340 and/or the duty corrector 310. Subsequently, the duty corrector 310 may perform an operation of correcting the duties of the clock signals CLK and CLKB, based on the stored correction code Corr_code.

The correction code Corr_code generated through a duty detection operation may have a value which is changed with respect to a value (for example, a target value) corresponding to a case where the duties of the output signals OCLK and OCLKB are symmetrical. For example, if the correction code Corr_code which is generated and stored at a certain time corresponds to a value of a large deviation with respect to the target value, a duty correction operation based on the stored correction code Corr_code is degraded in accuracy. However, the DCC 300 according to at least one example embodiment of the inventive concepts may calculate an average value of a plurality of the correction codes Corr_code to generate and store an average correction code Code_M and may perform the duty correction operation based on the average correction code Code_M, thereby enhancing an accuracy of the duty correction operation.

Referring to FIG. 10, a DCC 400 may perform an operation based on a plurality of control signals synchronized with a main clock and an operation of generating an average correction code by using an average filter. For example, the DCC 400 may include a duty corrector 410, a duty detector 420, and a timing controller 430, each of which may be implemented as circuits or circuitry. Additionally, the duty detector 420 may include a charge pump 421, a comparator 422, a counter 423, and an average filter 424, each of which may be implemented as circuits or circuitry. In an embodiment illustrated in FIG. 10, the average filter 424 may be assumed as being included in the duty detector 420, and moreover, the average filter 424 may be assumed as including a register 424_1 that stores a correction code Corr_code and an average correction code Code_M.

The duty corrector 410 may receive clock signals CLK and CLKB to generate output signals OCLK and OCLKB generated by correcting duties of the clock signals CLK and CLKB. The charge pump 421 may receive the output signals OCLK and OCLKB fed back thereto to generate pump voltages CPO and CPOB, based on a charge and discharge operation of a capacitor. The counter 423 may generate the correction code Corr_code, based on the pump voltages CPO and CPOB.

The timing controller 430 may generate a plurality of control signals Ctrl_T synchronized with a main clock according to the above-described embodiment, and the control signals Ctrl_T may include a control signal for controlling a sensing operation of the charge pump 421 and a control signal for controlling a pre-charge operation of the charge pump 421. Additionally, the control signals Ctrl_T may include a control signal that controls the counter 423 to generate the correction code Corr_code. The timing controller 430 may receive the main clock to generate the plurality of control signals Ctrl_T having different phases, and the clock signals CLK and CLKB input to the DCC 400 may each be used as the main clock.

According to the above-described embodiment, since the sensing operation and pre-charge operation of the charge pump 421 are controlled based on the control signals Ctrl_T synchronized with the main clock, duty correction performance is enhanced, and a time taken in duty correction is shortened. Additionally, the average correction code Code_M supplied from the average filter 424 may have a small deviation with respect to a target value, and thus, when duties of the clock signals CLK and CLKB are adjusted by using the average correction code Code_M, symmetry between the duties of the clock signals CLK and CLKB is enhanced.

Figure 11:
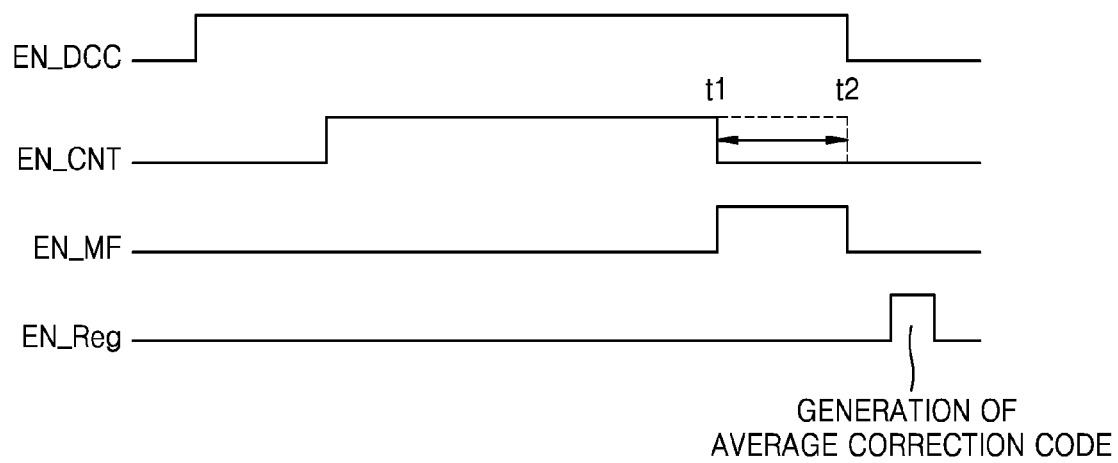
FIG. 11 is a waveform diagram showing an operation example of the DCC illustrated in FIGS. 9 and 10.

FIG. 11 is a waveform diagram showing an operation example of the DCC illustrated in FIGS. 9 and 10. In describing the waveform diagram of FIG. 11, the DCC illustrated in FIG. 10 will be referred to.

Power may be applied to a semiconductor device including the DCC 400, and the DCC 400 may be enabled in an initial operation of the semiconductor device. Various control signals associated with an operation of the DCC 400 illustrated in FIG. 11 may be generated in the semiconductor device, and for example, the control signals may be generated by the timing controller 430 illustrated in FIG. 10.

A control signal EN_DCC for enabling the DCC 400 may be activated during a certain period, and moreover, the counter 423 may be enabled by a control signal EN_CNT which is activated during a certain period, for generating the correction code Corr_code. Before the DCC 400 is disabled, the average correction code Code_M may be generated by using a plurality of the correction codes Corr_code, and to this end, the average filter 424 may be enabled by a control signal EN_MF which is activated during a certain period.

The counter 423 and the average filter 424 may be enabled or disabled at various times. For example, the average filter 424 may be enabled after the counter 423 is disabled. Alternatively, the counter 423 and the average filter 424 may be simultaneously disabled. For example, the counter 423 may be disabled between a first time t1 when the average filter 424 is enabled and a second time t2 when the average filter 424 is disabled.

For example, the counter 423 may be disabled at the first time t1, and the average filter 424 may calculate an average value by using five correction codes Corr_code lastly received from the counter 423 to generate the average correction code Code_M as a result of the calculation. Alternatively, a plurality of correction codes Corr_code which are generated by the counter 423 during a certain period may be supplied to the average filter 424, and after the average correction code Code_M is generated, the counter 423 and the average filter 424 may be simultaneously disabled.

As described above, the generated average correction code Code_M may be stored in the register 424_1 included in the average filter 424, and the average correction code Code_M stored in the register 424_1 may be supplied to the duty corrector 410 in response to a register control signal EN_Reg.

Figure 12:
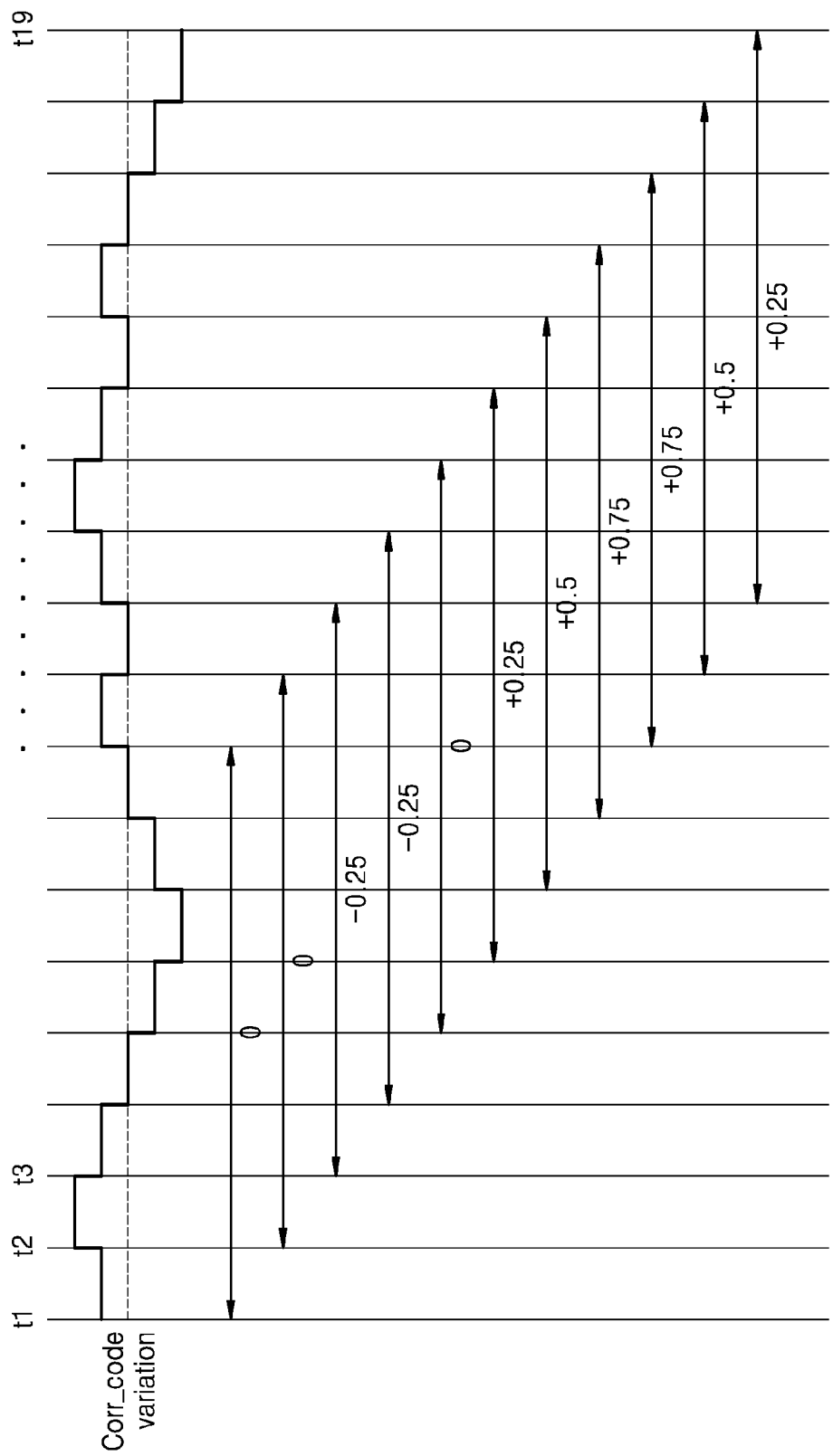
FIG. 12 is a waveform diagram showing an example of an average correction code generated by the DCC illustrated in FIGS. 10 and 11.

FIG. 12 is a waveform diagram showing an example of the average correction code Code_M generated by the DCC illustrated in FIGS. 10 and 11. An example, where the average correction code Code_M is generated by performing an arithmetic operation based on eight correction codes Corr_code, is illustrated in FIG. 12. In describing the waveform diagram of FIG. 12, the DCC illustrated in FIG. 10 will be referred to.

Referring to FIG. 12, if the duties of the clock signals CLK and CLKB are 50:50, the correction code Corr_code may have a value (for example, a target value) illustrated as a dot line. Additionally, the value of the correction code Corr_code generated by the duty detector 420 may be smaller or larger than the target value, based on the duties of the clock signals CLK and CLKB. When it is assumed that the target value is 0, the counter 423 may count +1 or −1 according to a result of comparison by the comparator 422. For example, when sensing is performed for the first and second pump voltages CPO and CPOB a plurality of times, the comparator 422 may provide a plurality of comparison results. When the first pump voltage CPO is higher than the second pump voltage CPOB, the counter 423 may count +1, and when the first pump voltage CPO is lower than the second pump voltage CPOB, the counter 423 may count −1.

When it is assumed that a result of detection by the duty detector 420 is based on a waveform shown in FIG. 12, the average filter 424 according to at least one example embodiment of the inventive concepts may calculate an average value of a plurality of the correction codes Corr_code. For example, when the counter 423 is disabled at a time t9, the average filter 424 may calculate an average value of eight correction codes (or correction codes which are generated at a time t1 to a time t8) immediately before the time t9. A result of the calculation may correspond to 0.

The counter 423 may be disabled at various times, and thus, a plurality of the correction codes Corr_code which are supplied to the average filter 424 and are used to calculate an average value may have various values. For example, when the average filter 424 uses a plurality of the correction codes Corr_code which are generated at a time t3 to a time t10, the average filter 424 may generate the average correction code Code_M corresponding to −0.25. Alternatively, when the average filter 424 uses a plurality of the correction codes Corr_code which are generated at a time t7 to a time t15, the average filter 424 may generate the average correction code Code_M corresponding to +0.5. Alternatively, when the average filter 424 uses a plurality of the correction codes Corr_code which are generated at the time t9 to a time t17, the average filter 424 may generate the average correction code Code_M corresponding to +0.75.

According to the above-described embodiment, the average correction code Code_M used for actual duty correction may have a value where a deviation with respect to a target value of the correction code Corr_code is reduced, and thus may have a code value suitable for the actual duty characteristics of the clock signals CLK and CLKB. For example, the DCC 400 may have the feedback structure, and thus, even when the correction code Corr_code converges to a certain value, one of the correction codes Corr_code selected at a certain time may have a large deviation with respect to the target value. However, as shown in FIG. 12, an average value of a plurality of the correction codes Corr_code which progressively converges to the target value may be calculated, and the average correction code Code_M may be used for a duty correction operation as a result of the calculation, thereby enhancing duty correction performance. Additionally, the average filter 424 may be implemented with only an adder for a plurality of the correction codes Corr_code.

Figure 13:
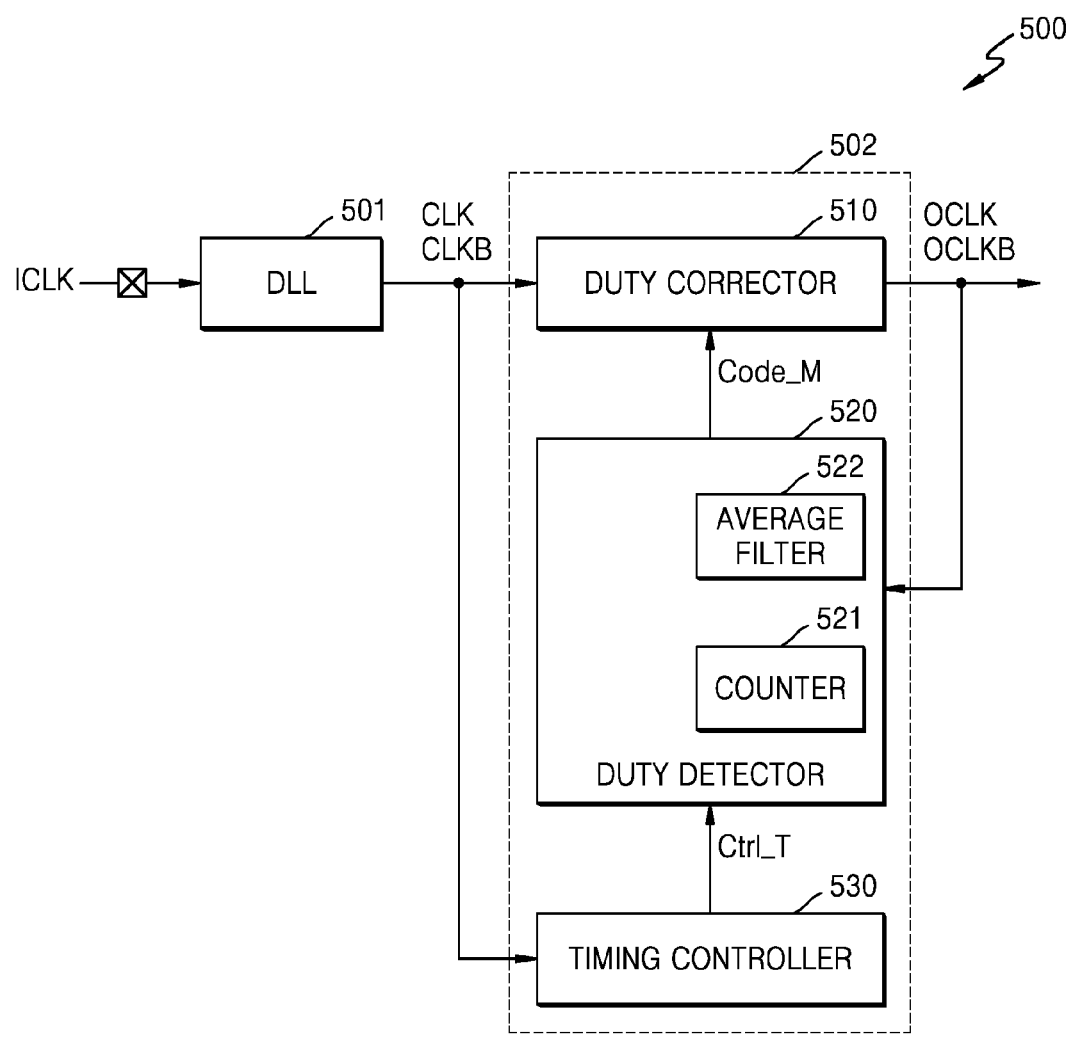
FIG. 13 is a block diagram illustrating an implementation example of a DCC according to modifiable embodiments.

FIG. 13 is a block diagram illustrating an implementation example of a DCC according to modifiable embodiments.

Referring to FIG. 13, a DCC 502 according to at least one example embodiment of the inventive concepts may be included in a semiconductor device 500, and the DCC 502 may receive clock signals CLK and CLKB from a clock generator (for example, a DLL) 501 to adjust duties of the clock signals CLK and CLKB. The clock generator 501 may receive an input clock ICLK which is input through a pad of the semiconductor device 500, and may supply a signal, generated by adjusting a phase of the input clock ICLK, as each of the clock signals CLK and CLKB. The semiconductor device 500 may correspond to various kinds of devices, and for example, may correspond to various memory devices such as a dynamic random access memory (DRAM), a resistive memory device, etc. Alternatively, the semiconductor device 500 may be a semiconductor chip including a function that generates or receives a clock and adjusts a duty of the generated clock or the received clock. For example, the semiconductor device 500 may be a device, which performs various functions, such as an application processor, a display driving chip, an image sensor chip, or the like.

The DCC 502 may include various circuit blocks according to the above-described embodiment, and for example, may include a duty corrector 510, a duty detector 520, and a timing controller 530, each of which may be implemented as circuits or circuitry. Additionally, the duty detector 520 may include a counter 521 and an average filter 522. In addition, the duty detector 520 may further include elements such as a charge pump and/or a comparator according to the above-described embodiment. The timing controller 530 may generate a plurality of control signals Ctrl_T synchronized with a main clock, and for example, the clock signals CLK and CLKB output from the clock generator 501 may be supplied to the timing controller 530.

According to at least one example embodiment of the inventive concepts, as the clock generator 501 and the DCC 502 are enabled in an initial operation of the semiconductor device 500, a delay synchronization operation and a duty correction operation may be performed. After an initial lock of the clock generator 501 is completed, the DCC 502 may further perform a duty detection operation during a certain period. For example, even after the initial lock of the clock generator 501 is completed, the DCC 502 may perform an operation that generates a plurality of correction codes and calculates an average value of the correction codes to generate an average correction code Code_M.

Figure 14:
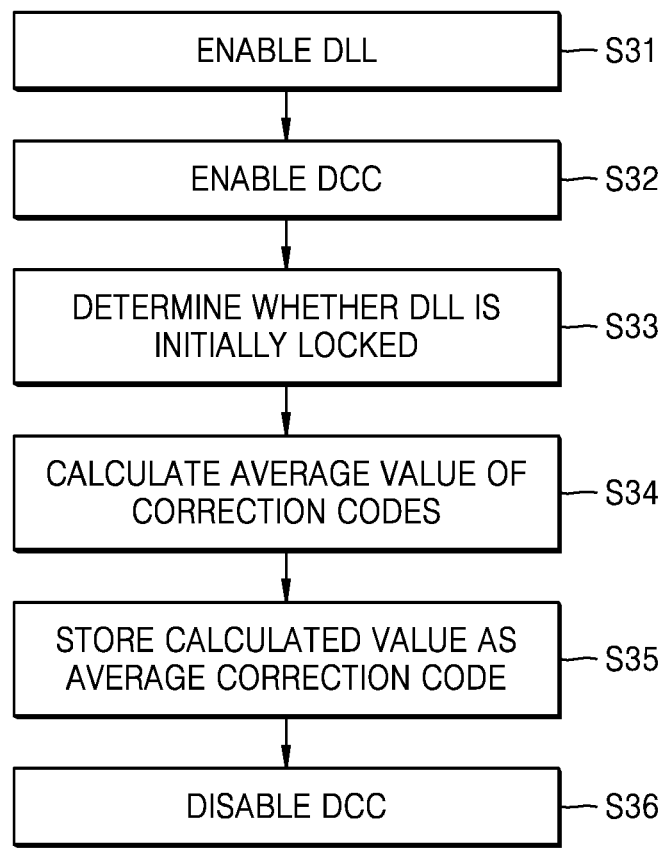
FIG. 14 is a flowchart illustrating a method of operating a semiconductor device illustrated in FIG. 13.

FIG. 14 is a flowchart illustrating a method of operating the semiconductor device 500 illustrated in FIG. 13. Referring to FIGS. 13 and 14, when the semiconductor device 500 is initially driven, the clock generator 501 may be enabled in operation S31, and simultaneously, the DCC 502 may be enabled in operation S32. The clock generator 501 may perform an operation of receiving an input clock ICLK and adjusting a phase of the input clock ICLK. Whether the clock generator 501 is initially locked may be determined by determining an output signal of the clock generator 501 in operation S33. After the initial lock of the clock generator 501 is completed, the DCC 502 may perform an additional operation to calculate an average value of a plurality of correction codes in operation S34.

The calculated average value may be stored as an average correction code Code_M in the DCC 502 in operation S35, and then, the DCC 502 may be disabled in operation S36. The DCC 502 being disabled may denote a state where a feedback structure of output signals OCLK and OCLKB is broken, and in this case, the duty corrector 510 may adjust duties of clock signals CLK and CLKB by using the stored average correction code Code_M.

Figure 15:
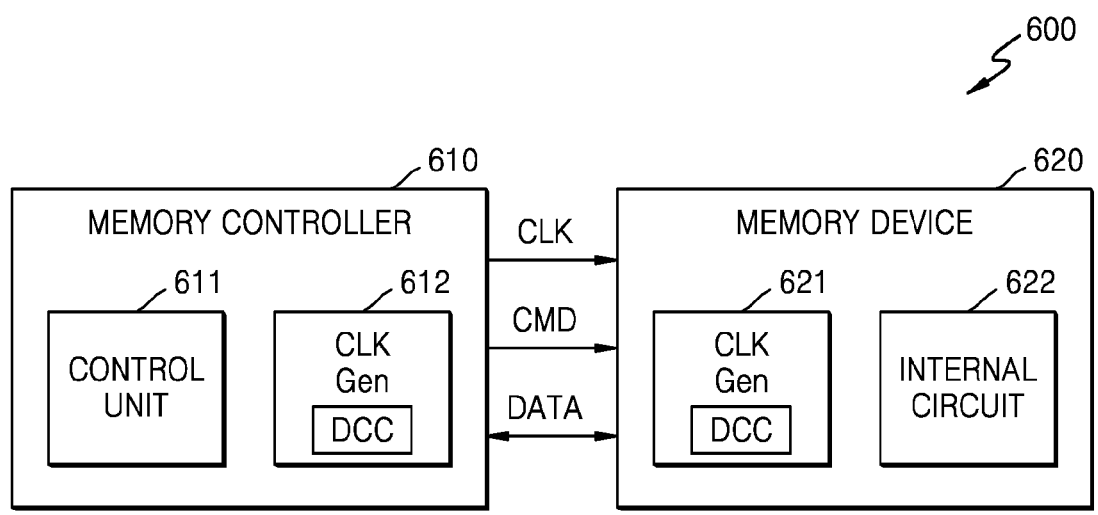
FIG. 15 is a block diagram illustrating a memory system including a DCC according to embodiments.

FIG. 15 is a block diagram illustrating a memory system 600 including a DCC according to embodiments.

As illustrated in FIG. 15, the memory system 600 may include various kinds of memory devices, and for example, as described above, the memory system 600 may include a volatile memory including a DRAM and/or the like or may include a nonvolatile memory including a flash memory device, a resistive memory device, and/or the like. The memory system 600 may include a memory controller 610 and a memory device 620. A clock signal CLK, a command CMD, data DATA, and/or the like may be transmitted or received between the memory controller 610 and the memory device 620.

The memory controller 610 may include a control unit 610 which may be a circuit that generates various control signals for controlling an operation of a memory, and may also include a clock generator 612 which may be a circuit that generates the clock signal CLK supplied to the memory device 620. The clock generator 612 may include the DCC according to at least some example embodiments of the inventive concepts (e.g. the DCC 100, 200, 300, 400, and/or 502) in order for duties of clock signals CLK to be symmetrical.

Similarly, the memory device 620 may include a clock generator 621 that generates an internal clock signal by using the clock signal CLK. According to the above-described embodiments, the clock generator 621 may use a clock generator such as a PLL or a DLL. Additionally, the clock generator 621 may include the DCC according to at least some example embodiments of the inventive concepts (e.g. the DCC 100, 200, 300, 400, and/or 502). The internal clock signal generated by the clock generator 621 may be supplied to an internal circuit 622, and the internal clock signal generated by the clock generator 621 may be used in operations of various memories.

In the embodiment of FIG. 15, the DCC according to the embodiments is illustrated as being included in the clock generator 612 (621), but is not limited thereto. In other embodiments, the DCC may be provided outside the clock generator 612 (621).

Figure 16:
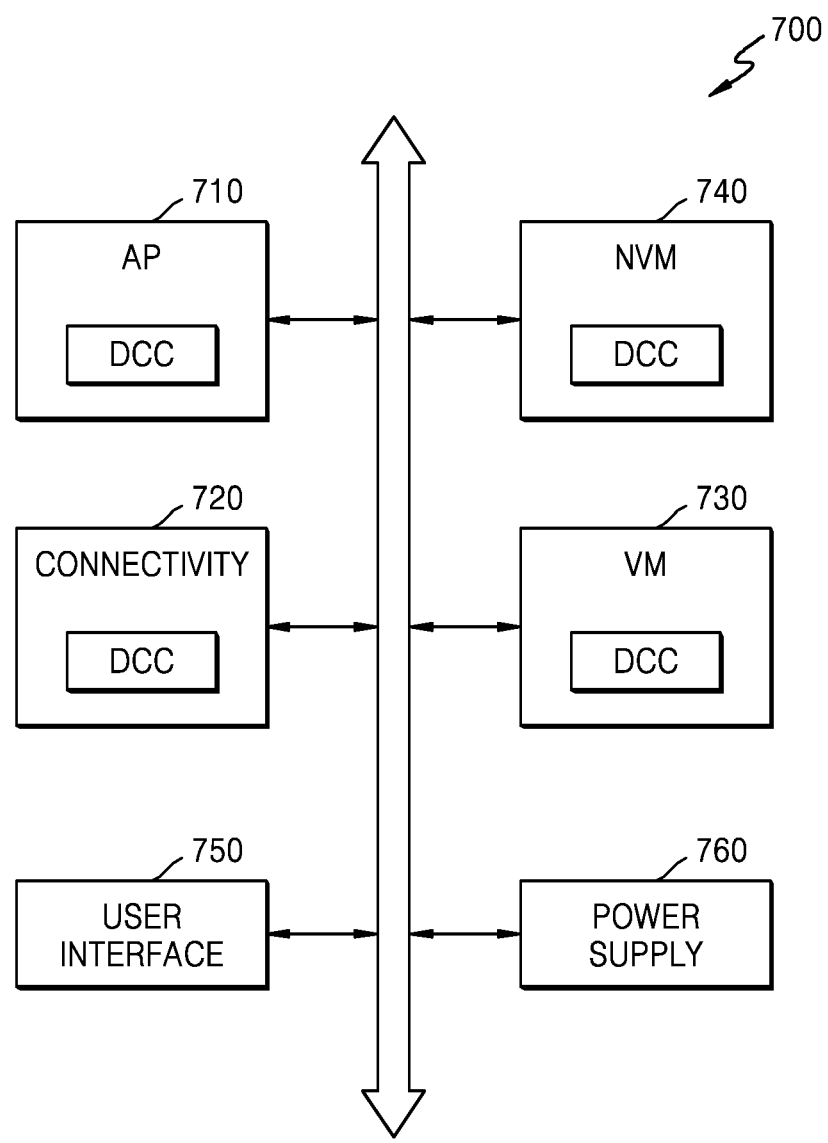
FIG. 16 is a block diagram illustrating an example where a DCC according to embodiments is applied to a computing system.

FIG. 16 is a block diagram illustrating an example where a DCC according to embodiments is applied to a computing system 700. For example, the computing system 700 may correspond to a mobile device.

Referring to FIG. 16, the computing system 700 may include an application processor 710, a connectivity unit 720, a volatile memory device 730, a nonvolatile memory device 740, a user interface 750, and a power supply 760. According to at least one example embodiment of the inventive concepts, the computing system 700 may be an arbitrary mobile system such as a mobile phone, a smartphone, a personal digital assistant (PDA), a portable multimedia player (PMP), a digital camera, a music player, a portable game console, a navigation system, or the like.

The application processor 710 may control an overall operation of the computing system 700. The application processor 710 may include a single processor core or a plurality of processor multicores. For example, the application processor 710 may include a multicore such as a dual-core, a quid-core, a hexa-core, and/or the like.

The connectivity unit 720 may perform wired or wireless communication with an external device. For example, the connectivity unit 720 may include one or more circuits or circuitry that performs Ethernet communication, near field communication (NFC), radio frequency identification (RFID) communication, mobile telecommunication, memory card communication, universal serial bus (USB) communication, and/or the like. For example, the connectivity unit 720 may include a baseband chipset and may support communication such as GSM, GRPS, WCDMA, HSxPA, and/or the like.

The volatile memory device 730 may store data obtained through processing by the application processor 710 or may operate as a working memory. For example, the volatile memory device 730 may be implemented with DRAM, static random access memory (SRAM), mobile DRAM, DDR SDRAM, LPDDR SDRAM, GDDR SDRAM, RDRAM, or a memory similar thereto.

The nonvolatile memory device 740 may store a boot image for booting the computing system 700. For example, the nonvolatile memory device 740 may be implemented with electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a memory similar thereto.

The application processor 710, the connectivity unit 720, the volatile memory device 730, and the nonvolatile memory device 740 may each include the DCC according to the embodiments. For example, the application processor 710, the connectivity unit 720, the volatile memory device 730, and the nonvolatile memory device 740 may each operate in synchronization with a certain clock signal and may each include the DCC according to at least some example embodiments of the inventive concepts (e.g. the DCC 100, 200, 300, 400, and/or 502) for correcting a duty of a received clock signal. Therefore, the DCC included in a function block configuring the computing system 700 may perform an operation of detecting a duty and an operation of correcting the duty, based on a plurality of control signals synchronized with a main clock. Additionally, the DCC may include an average filter that calculates an average value of a plurality of correction codes, and may perform an operation of correcting a duty by using an average correction code from the average filter.

The user interface 750 may include one or more input devices, such as a keypad, a touch screen, etc., and/or one or more output devices such as a speaker, a display device, etc. The power supply 760 may supply an operation voltage of the computing system 700. Further, according to at least one example embodiment of the inventive concepts, the computing system 700 may further include a camera image processor (CIP) and may further include a storage device such as a memory card, a solid state drive (SSD), a hard disk drive (HDD), a CD-ROM, or the like.

In the DCC, the semiconductor device including the same, and the method of operating the duty cycle corrector according to the embodiments, the comparison operation and the counting operation may be performed at a time when the pumping voltages from the charge pumps are sufficiently developed, and moreover, an influence of ripple which occurs in the pumping voltages is reduced, thereby enhancing duty correction performance.

Moreover, in the DCC, the semiconductor device including the same, and the method of operating the duty cycle corrector according to the embodiments, a time taken in duty correction is shortened by applying the pre-charge period for the pumping voltages from the charge pump.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A duty cycle corrector (DCC) comprising:
a duty corrector circuit configured to adjust a duty of an input signal to output a duty-adjusted signal;
a duty detector circuit configured to generate a correction code associated with the adjustment of the duty, based on a charge pump operation and a counting operation; and
a timing controller configured to generate a first control signal and a second control signal in synchronization with a first clock,
the first control signal being associated with the charge pump operation,
the second control signal being different from the first control signal and associated with the counting operation,
wherein,
the input signal includes a first signal and a second signal having opposite phases, and
at least one of the first signal and the second signal is supplied as the first clock to the timing controller,
wherein the duty detector circuit comprises:
a charge pump configured to receive an output signal fed back from the duty corrector circuit and output differential pump voltages based on a duty of the output signal;
a comparator configured to generate a comparison result based on levels of the differential pump voltages; and
a counter configured to generate the correction code by performing a counting operation based on the comparison result from the comparator,
wherein the charge pump includes a first output terminal through which a first one of the differential pump voltages is output and a second output terminal through which a second one of the differential pump voltages is output,
wherein the charge pump is configured such that an operation of the charge pump includes,
a develop period where the levels of the differential pump voltages are shifted according to the duty of the output signal,
a sensing period where the differential pump voltages are supplied to the comparator, and
a pre-charge period where the first and second output terminals are electrically connected to each other.

2. The DCC of claim 1, wherein
the first control signal includes a sensing control signal for activating the sensing period and a pre-charge control signal for activating the pre-charge period, and
the timing controller is configured such that the sensing control signal and the pre-charge control signal are each generated in synchronization with the first clock and have different phases.

3. The DCC of claim 1, wherein the counter is configured such that the counter performs the counting operation by, in response to the second control signal, counting the comparison result at a time after the sensing period ends.

4. The DCC of claim 1, wherein the charge pump comprises:
first and second capacitors connected to first and second output nodes, respectively;
a first switch connected to the first output node to control an electrical connection between the first output node and a first input terminal of the comparator;
a second switch connected to the second output node to control an electrical connection between the second output node and a second input terminal of the comparator; and
a third switch configured to control an electrical connection between the first output node and the second output node.

5. The DCC of claim 4, wherein the first control signal comprises:
a sensing control signal configured to control the first switch and the second switch for voltages, respectively charged into the first and second capacitors, to be supplied to the comparator; and
a pre-charge control signal configured to control the third switch to electrically connect the first output node to the second output node.

6. The DCC of claim 1, wherein,
the input signal is shifted between a logic low level and a logic high level, and
the first control signal is activated once in one logic level period of the input signal.

7. The DCC of claim 1, wherein,
the duty corrector circuit is configured to adjust the duty of the input signal to generate an output signal,
the DCC is configured such that the output signal is supplied to the duty detector circuit with a first delay, and
the timing controller is configured to,
receive information about the first delay, and
adjust an activation timing of at least one of the first and second control signals, based on the information about the first delay.

8. A semiconductor device comprising:
a clock generator; and
a duty cycle corrector (DCC) configured to receive a first clock signal from the clock generator and adjust a duty of the first clock signal to output a second clock signal,
wherein the DCC includes,
a duty corrector circuit configured to adjust the duty of the first clock signal,
a timing controller configured to generate first, second and third control signals synchronized with the first clock signal, a phase of the first control signal being different from that of the third control signal, and
a duty detector circuit including a charge pump, a counter, and a comparator,
the charge pump being configured to generate differential pump voltages corresponding to a duty of the second control signal,
the charge pump including a first output terminal through which a first one of the differential pump voltages is output and a second output terminal through which a second one of the differential pump voltages is output,
the comparator being configured to generate a comparison result based on levels of the differential pump voltages, the counter being configured to generate a correction code by performing a counting operation based on the comparison result generated by the comparator, the duty detector circuit being configured to,
- sense the differential pump voltages in response to the first control signal,
- electrically connect the first and second output terminals in response to the second control signal, and
- perform the counting operation in response to the third control signal after the sensing of the differential pump voltages ends, wherein the charge pump comprises:
- first and second capacitors connected to first and second output nodes, respectively;
- a first switch connected to the first output node to control an electrical connection between the first output node and a first input terminal of the comparator;
- a second switch connected to the second output node to control an electrical connection between the second output node and a second input terminal of the comparator; and
- a third switch configured to control an electrical connection between the first output node and the second output node.

9. The semiconductor device of claim 8, wherein the clock generator includes a delay locked loop (DLL) or a phase locked loop (PLL).

10. The semiconductor device of claim 8, wherein the main clock is the first clock signal.

11. A duty cycle corrector (DCC) comprising:
- a duty corrector circuit configured to output a duty-adjusted signal to a device by adjusting a duty cycle of an input signal based on a correction code;
- a duty detector circuit including a charge pump and a comparator, the charge pump being configured to generate first and second differential pump voltages, the comparator being configured sense the first and second differential pump voltages based on a sensing control signal, the comparator being configured to generate a comparison result based on the sensed first and second differential pump voltages, the duty detector circuit being configured to generate the correction code based on the comparison result; and
- a timing controller configured to receive delay information and generate the sensing control signal based on the delay information, the delay information indicating a delay with which the duty-adjusted signal is provided to the device, wherein the charge pump comprises:
- first and second capacitors connected to first and second output nodes, respectively;
- a first switch connected to the first output node to control an electrical connection between the first output node and a first input terminal of the comparator;
- a second switch connected to the second output node to control an electrical connection between the second output node and a second input terminal of the comparator; and
- a third switch configured to control an electrical connection between the first output node and the second output node.

12. The DCC of claim 11 wherein the duty detector circuit further includes a counter configured to generate the correction code by performing a counting operation based on the comparison result.

13. The DCC of claim 12 wherein the counter is configured to generate the correction code in response to a code generation control signal.

14. The DCC of claim 13, wherein the comparator is configured to sense the first and second differential pump voltages during a sensing period defined by the sensing control signal.

15. The DCC of claim 14, wherein the timing controller is configured to generate the code generation control signal such that the counter generates the correction code after the sensing period.

* * * * *